United States Patent
Chang et al.

(10) Patent No.: US 8,315,085 B1
(45) Date of Patent: Nov. 20, 2012

(54) SRAM TIMING TRACKING CIRCUIT

(75) Inventors: Feng-Ming Chang, Chiayi (TW);
Chang-Ta Yang, Hsinchu (TW);
Huai-Ying Huang, Jhonghe (TW);
Ping-Wei Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/289,030

(22) Filed: Nov. 4, 2011

(51) Int. Cl.
*G11C 11/00* (2006.01)

(52) U.S. Cl. .................... 365/154; 365/201; 365/194

(58) Field of Classification Search .................. 365/154, 365/201, 194, 51, 156
See application file for complete search history.

(56) References Cited

U.S. PATENT DOCUMENTS

| | | | |
|---|---|---|---|
| 6,975,532 B1 | 12/2005 | Kosonocky et al. | |
| 7,177,177 B2 | 2/2007 | Chuang et al. | |
| 7,787,318 B2 * | 8/2010 | Satomi | 365/201 |
| 7,898,894 B2 | 3/2011 | Chang et al. | |
| 2011/0182112 A1 | 7/2011 | Houston | |

OTHER PUBLICATIONS

Lin, S. et al., "A Low Leakage 9T SRAM Cell for Ultra-Low Power Operation", GLSVLSI 2008 Proceedings of the 18th ACM Great Lakes Symposium on VLSI, 4 pages.
Lai, Y.C. et al., "Robust SRAM Design via BIST-Assisted Timing-Tracking (BATT)", IEEE Journal of Solid-State Circuits, Feb. 2009, 44(2):642-649.

\* cited by examiner

*Primary Examiner* — David Lam
(74) *Attorney, Agent, or Firm* — Duane Morris LLP (57) ABSTRACT

A timing tracking circuit is configured within a functional memory array, obviating the need for a separate, standalone timing tracking circuit. A generated pulse is routed circuitously through conductors enlisted for timing purposes, to trigger switching of a test cell in the array, which discharges an associated bit line from a pre-charged high value. The pulled down signal resulting from the discharge is detected at a measurement unit to infer timing characteristics of the memory array. The timing tracking circuitry is implemented by re-purposing certain conductors, test cells and dummy cells inserting certain conductive or nonconductive regions at one or more layers or at vias between layers to alter operation of the respective conductors and cells. Cells and conductors not enlisted for timing remain available for efficient, reliable memory access performance.

20 Claims, 11 Drawing Sheets

SRAM TIMING TRACKING CIRCUIT

BACKGROUND

Static random access memory (SRAM) is a type of semiconductor memory that stores data in the form of bits using bistable circuitry without the need for refreshing. An SRAM cell may be referred to as a bit cell because it stores a bit of information. Memory arrays include multiple bit cells arranged in rows and columns. Each bit cell in a memory array typically includes connections to a power supply voltage and to a reference voltage. Bit lines are used for accessing a bit cell, with a word line controlling connections to the bit lines. A word line may be coupled to the bit cells in a row of a memory array, with different word lines provided for different rows.

The time taken to access an SRAM bit cell, e.g., for a read operation, may vary due to factors including the relative position of the accessed bit cell within the SRAM array, and variation in operational characteristics of SRAM components such as transistors in bit cells. Reliable estimation of SRAM timing characteristics is important for ensuring consistency in system components and high system performance.

SUMMARY

In an embodiment disclosed herein, a memory apparatus includes a plurality of bit cells in an array, a plurality of word lines and bit lines, a pulse generator, a conductor, and a timing measurement circuit. The word lines and bit lines meet at the bit cells and are operated for selecting a given bit cell in the array by concurrently activating a word line and a bit line coupled to the given cell, for reading and/or writing to one or more selected bit cells. The pulse generator is configured to generate a test signal for operating a test bit cell at a predetermined location in the array. The test bit cell includes at least one switching transistor, which may include a passing gate (PG) transistor and a pull down (PD) transistor of the test bit cell. The conductor is configured to couple the pulse generator to the test bit cell and to conduct the test signal to the test bit cell. The conductor comprises an electrical path including at least a part of one of said bit lines and word lines that is enlisted for timing tracking purposes. The enlisted one of said bit lines and word lines carries the test signal for changing a state of the switching transistor at the selected one or more of the bit cells. The timing measurement circuit is configured to detect operation of the switching transistor and to determine a time delay between generation of the test signal by the pulse generator and detection of a current switched by the switching transistor. The delay is a function of the location of the test bit cell in the array relative to the location at which the pulse generator couples the test signal to the array.

In an embodiment, a method is provided of timing an operation in a static random access memory including multiple SRAM bit cells in an array. The bit cells are arranged in a pattern having multiple word lines and bit lines meeting at the bit cells and operated for selecting a given cell by concurrently activating a word line and a bit line coupled to that given cell. The method includes generating a word line signal at a pulse generator and conducting the word line signal along a first path including multiple word lines. The first path has a first predetermined length. The word line signal is conducted along a second path having a second predetermined length. The second path includes a first bit line enlisted for tracking propagation times. The first enlisted bit line is disabled from addressing an SRAM cell. A second bit line, enlisted for tracking propagation times, is coupled to a positive power supply voltage via a first switch. The word line signal is conducted to the first switch. The method includes opening the first switch, based on the word line signal, to decouple the second enlisted bit line from the positive power supply voltage, and closing a second switch, based on the word line signal conducted along the first enlisted bit line, to couple the second enlisted bit line to a ground node. The second enlisted bit line is coupled to the pulse generator, to provide a timing track signal to the pulse generator.

In an embodiment, an apparatus includes multiple SRAM bit cells in an array. The bit cells are arranged in a pattern having multiple word lines and bit lines meeting at the bit cells and operated for selecting a given cell by concurrently activating a word line and a bit line coupled to that given cell. The SRAM cells include nominal cells and at least one test cell. A first bit line and a second bit line are enlisted for tracking a propagation time between selecting the test cells and sensing of a resulting test current at the test cells. The first and second enlisted bit lines are disabled from addressing the test cells. A word line pulse generator is configured to generate a word line signal. A conductor is configured to conduct the word line signal to a first word line. A first electrical path includes the first word line and at least one other word line, with the path intersecting the first enlisted bit line. A switch, controllable by the word line signal, is configured to selectively couple the second enlisted bit line to a positive power supply voltage. A second electrical path couples the second enlisted bit line and the word line pulse generator. At least one of the test cells includes a first transistor (PG) having a gate coupled to the first enlisted bit line, and a second transistor (PD) having a gate coupled to a fixed voltage that forces said PD transistor into a conducting state, with the PG and PD transistors configured to couple the second enlisted bit line to a ground node when the word line signal on the first enlisted bit line controls the PG transistor to conduct current.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description.

Various embodiments of the present disclosure provide timing tracking functionality for accurate, efficient monitoring of static random access memory (SRAM) specific variation. Timing tracking enables determination of when a bit cell finishes a read or write operation. Timing tracking circuitry in various embodiments are implemented within an existing SRAM, i.e., using the SRAM itself Certain SRAM cells are modified at a metal-1 (M1) and VIA0 (between metal-0 and M1) layers and vias, which are described in detail below. No changes to front-end-of-line (FEOL) or M0 components (or, e.g., contact bars or slot contacts) are required to implement the timing tracking circuitry described herein. This is advantageous, at least because FEOL and M0 are sensitive to device performance.

Figure 1:
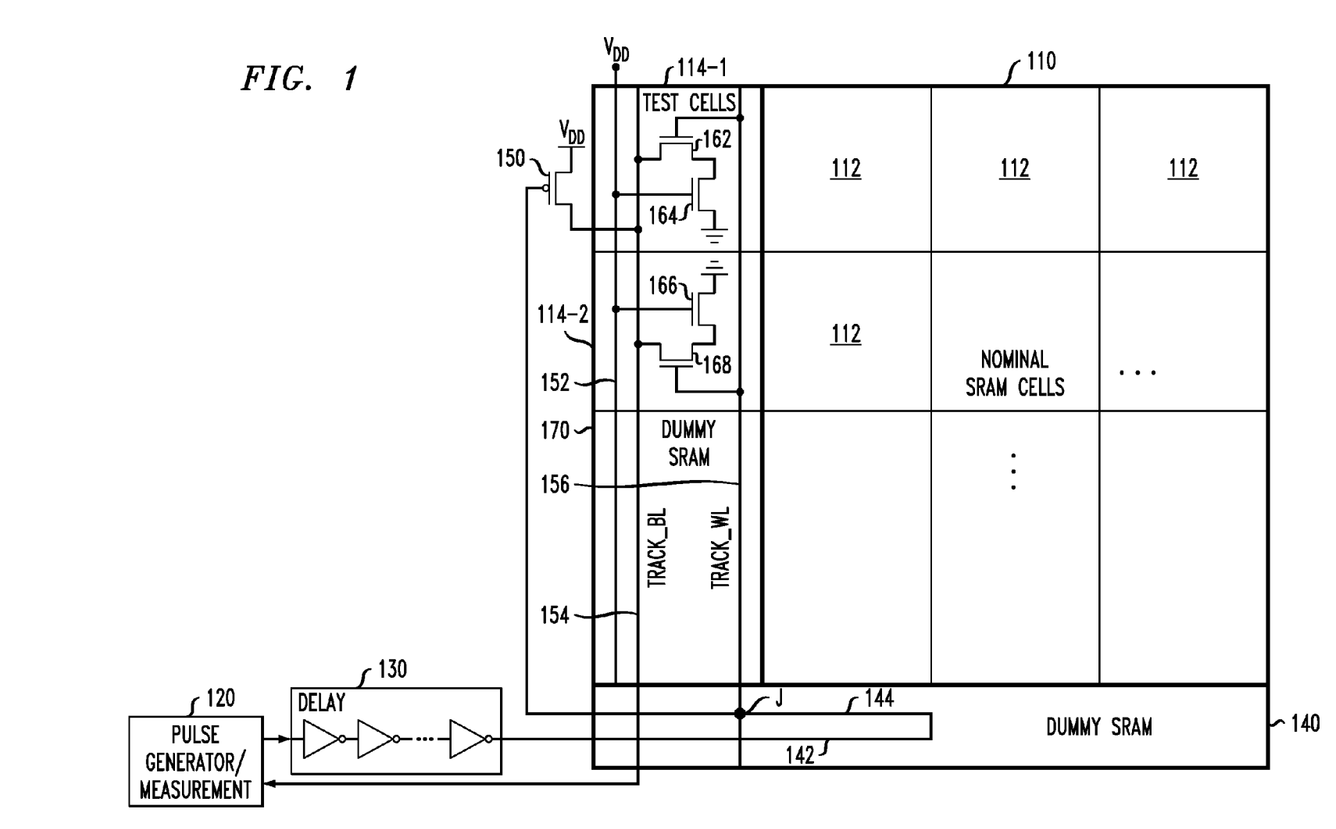
FIG. 1 is a schematic diagram of a static random access memory (SRAM) timing tracking apparatus in accordance with an exemplary embodiment.

FIG. 1 is a schematic diagram of an SRAM timing tracking apparatus in accordance with an exemplary embodiment. FIG. 1 shows a configuration in which a timing tracking circuit is configured within a functional SRAM array itself, obviating the need for a separate, standalone timing tracking circuit. Multiple SRAM bit cells are arranged in an SRAM array 110. The nominal bit cells are arranged in a pattern having multiple word lines and bit lines coupled to rows and columns of bit cells such that when a word line and a bit line are active, they select the bit cell at the point where the word lines and bit lines cross. According to the present embodiments, certain word lines and bit lines are enlisted to serve other functions in connection with testing operational delays.

Figure 3:
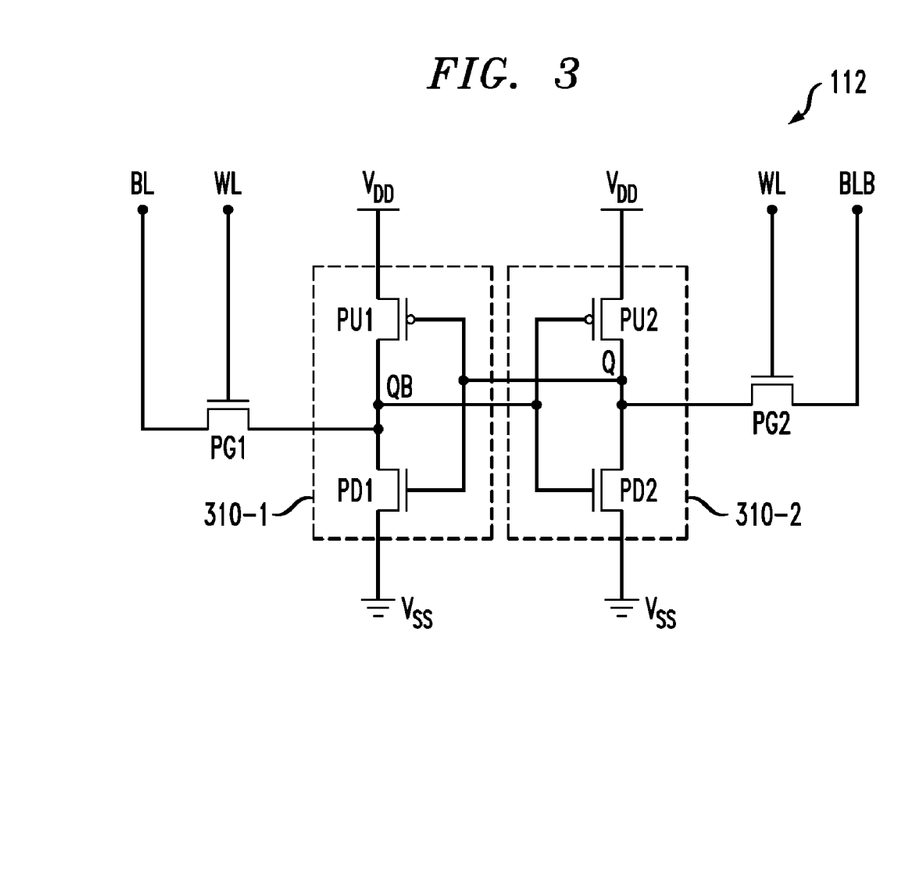
FIG. 3 is a schematic diagram of a nominal SRAM bit cell in accordance with an exemplary embodiment.

The word lines and bit lines are described in greater detail in the context of FIG. 3. A given bit cell is selected by concurrently activating a word line and a bit line coupled to the given cell. In the configuration shown in FIG. 1, a subset of the SRAM cells are adapted for timing tracking, so that a separate timing tracking circuit external to an SRAM array is not needed to emulate the array. In an embodiment shown in FIG. 1, SRAM cells that provide normal SRAM functionality, including storage of data bits and read and write operations, are referred to as nominal cells 112. A subset of the SRAM cells are enlisted, or re-purposed, for timing tracking and are referred to as test cells 114. Two test cells 114-1 and 114-2 are shown in FIG. 1, although various numbers of test cells, including one test cell, may be used. In the exemplary embodiments, the test cells 114 do not function as the nominal SRAM cells do in terms of storing data and supporting read/write operations. Rather, various bit lines that are otherwise used for addressing cells in the case of nominal cells are enlisted for other purposes. Three such enlisted bit lines are shown in FIG. 1: bit line 152 is enlisted to be coupled (tied) to a fixed voltage denoted $V_{TIED}$, and bit lines 154 and 156 are enlisted to conduct signals TRACK_BL and TRACK_WL, respectively, and those signals are detailed in the following discussion.

Figure 2:
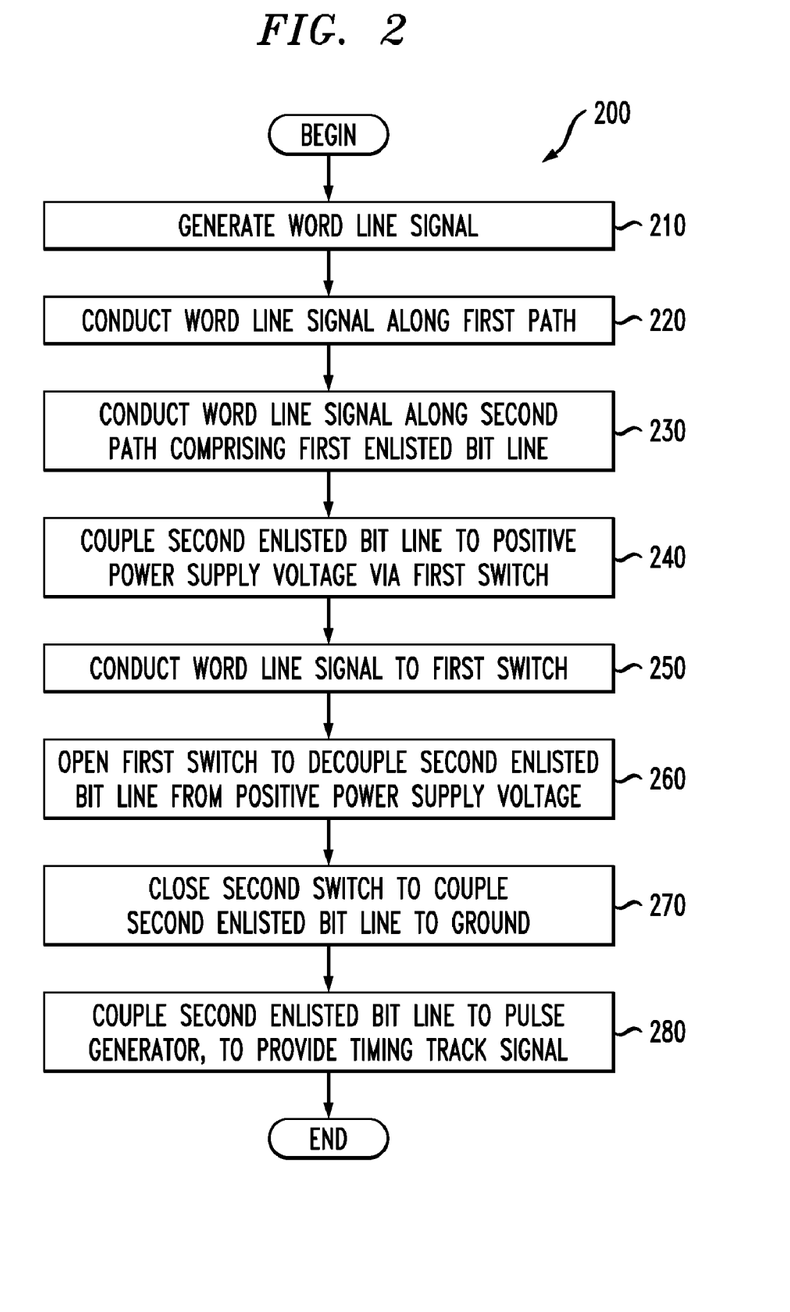
FIG. 2 is a flow diagram of a process in accordance with an exemplary embodiment.

FIG. 2 is a flow diagram of a process in accordance with an exemplary embodiment. After process 200 begins, a pulse generator 120 generates (210) a word line signal. The pulse generator 120 may also provide measurement functionality for measuring a return signal described below, e.g., by commencing a timing operation. An optional delay chain 130, which may include a string of inverters or other delay elements, provides a fixed basic delay in case it is convenient to insert a delay so as to move ahead the measurement window in which the tracking delay will be discerned. After the optional delay, the word line signal is applied to cells in a region of the SRAM array 110 designated dummy SRAM 140. In the example shown in FIG. 1, existing word lines 142 and 144 of the SRAM 110 are enlisted to convey the signal for timing tracking purposes. Thus, word lines 142 and 144 are disabled from addressing bit cells in the corresponding rows of the SRAM and are used as vehicles to transport a signal for another purpose. In this example, the signal is transported along conductor 142 about halfway across a row of the SRAM array, and then is transported back along conductor 144 to the first (leftmost in FIG. 1) column of the array, at a junction J. This topology, in which the path taken by the word line signal up to junction J has a hairpin shape, models a case in which a bit cell in the last (rightmost in FIG. 1) column would be accessed, e.g., for a read operation. In other words, the length of the path along conductors 142 and 144 up to junction J may be approximately equal to the width of the SRAM array (distance across a row from one edge of the array to the other, according to the orientation of the array in FIG. 1). This routing along conductors 142 and 144 emulates the signal routing delay in a functional SRAM array. Other shapes and lengths for the path from delay block 130 to junction J may be used in other examples. Thus, the word line signal is conducted (220) along a first path including multiple word lines, with the first path having a first predetermined length.

The word line signal is conducted (230) from junction J to test cells 114-1 and 114-2 along a second path having a second predetermined length. The second path is a vertical path in the example of FIG. 1 and includes an enlisted bit line TRACK_WL, which is enlisted for tracking propagation times. The sum of the lengths of the first and second paths is such that the metal routing delay for accessing a cell at the top right corner of array 110 is emulated. In this example, the enlisted conductors, including bit line TRACK_WL, are disabled permanently from addressing an SRAM cell to read and write a logic value in the normal way, and instead are devoted to timing tracking It would also be possible to arrange for conductors and/or bit cell transistors to be enlisted temporarily by switching them from an operational memory configuration to a timing tracking configuration using additional switching transistors (not shown).

Enlisted bit line TRACK_BL as shown is coupled to a positive power supply voltage VDD by a switch when the switch is in the closed state. The switch may be a PMOS transistor 150 as shown in FIG. 1. Thus, TRACK_BL is pre-charged to a logical high voltage value. The gate of transistor 150 is coupled to conductor 144 to conduct (250) the word line signal to the transistor, to turn off (260) the transistor (open the switch), thereby decoupling TRACK_BL from $V_{DD}$. In test cell 114-1, NMOS transistor 162 is turned on by provision of the word line signal on enlisted bit line TRACK_WL to the gate of the transistor. NMOS transistor 164 is maintained in an "on" state by the coupling of the gate of that transistor to enlisted bit line 152, which is coupled to fixed voltage $V_{TIED}$, which may be a logical high voltage such as $V_{DD}$. Thus, the switch provided by transistor 162 is closed (270) to couple TRACK_BL to ground. Similar functionality is provided at test cell 114-2 with transistors 166 and 168. Thus, when transistor 150 is turned off, the formerly high voltage at enlisted bit line TRACK_BL discharges to ground via transistors 162 and 164 (at test cell 114-1) and via transistors 168 and 166 (at test cell 114-2). The pulled-low TRACK_BL is coupled (280) to pulse generator 120, so that the pulled-down signal on TRACK_BL (asserted low) that arrives at the measurement unit (also denoted as 120) may be measured for timing tracking, as the read operation emulated in the functional SRAM (e.g., nominal cells 112) has been completed.

In this timing tracking configuration, most of the cells in the SRAM array are unaltered from their normal SRAM configuration and are nominal cells. Because word line conductors 142 and 144 are enlisted to convey a word line signal for timing tracking purposes, those conductors are disabled from addressing bit cells in their respective rows in the usual SRAM manner, so those rows are effectively disabled from normal SRAM functionality and are labeled dummy SRAM cells 140 in FIG. 1. Similarly, because enlisted bit lines 152, 154, and 156 are repurposed to support timing tracking functionality at test cells 114-1 and 114-2 as described above, those bit lines are disabled from addressing bit cells in their corresponding columns in the usual SRAM manner. Thus, other bit cells in the first column are denoted dummy SRAM cells 170. Dummy cells 140 and 170 enable the capacitive and resistive environment to be matched closely for accurate modeling. Bit lines that are tracked typically have two factors that determine propagation delay of signals that are carried, namely serial resistance and parallel capacitance. Dummy cells have real capacitive load, and mimic the capacitance of unenlisted bit lines in nominal cells. If dummy cells were not provided, the length of enlisted bit lines would effectively appear to be shorter that the lines they are intended to emulate, which would decrease resistance and capacitance, and which might lead tracking circuitry to determine that read or write operations have concluded prematurely. Dummy cells 140 and 170 also fill out the array.

FIG. 3 is a schematic diagram of a nominal SRAM bit cell 112 in accordance with an exemplary embodiment. The structure and function of bit cell 112 is known to one of ordinary skill. Bit cell 112 includes a pair of access transistors PG1 and PG2 biased by a word line WL and providing access to cross-coupled inverters 310-1 and 310-2, respectively. "PG" in PG1 and PG2 may stand for "passing gate" because they pass signals on the bit lines to the nodes of the cross coupled inverters when the word line signal at the gate terminal of transistors PG becomes true. Inverter 310-1 includes a pull-up PMOS transistor PU1 and a pull-down NMOS transistor PD1, and inverter 310-2 includes a pull-up PMOS transistor PU2 and a pull-down NMOS transistor PD2. Transistors PG1 and PG2 respectively are coupled to a first bit line BL ("bit line") and to a second bit line BLB ("bit line bar" or bit line complement). This configuration is referred to as a 6T (six-transistor) configuration. During standby mode, WL is not asserted, and the access transistors PG1 and PG2 disconnect the bit cell from the bit lines. The cross-coupled inverters are coupled to the power supply and reinforce each other to maintain one of two possible logic states with a stored data bit at one of the nodes between the inverters (node Q) and the complement of that bit at the other node between the inverters (node QB). For a read operation, BL and BLB are precharged high, and WL is asserted. The stored data bit at node Q is transferred to BL, and the data bit at node QB is transferred to BLB. For a write operation, the value to be written is provided at BL, and the complement of that value is provided at BLB, when WL is asserted.

Figure 4:
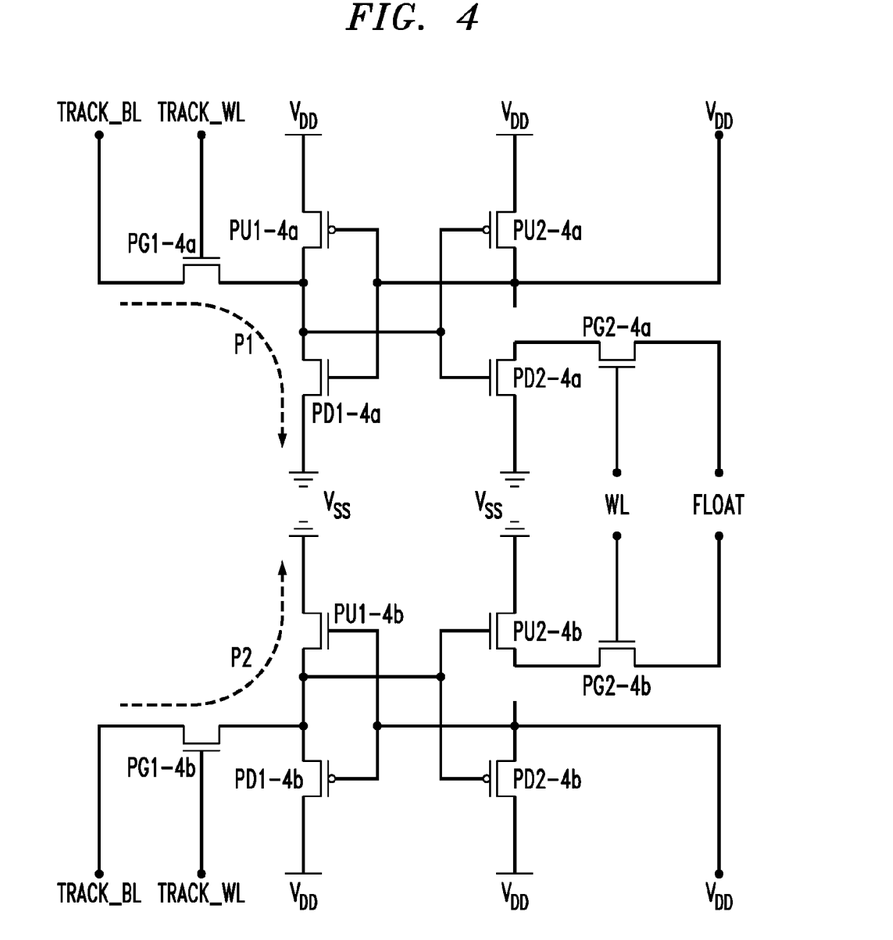
FIG. 4 is a schematic diagram of SRAM test cells configured for timing tracking in accordance with an exemplary embodiment.

FIG. 4 is a schematic diagram of SRAM test cells configured for timing tracking in accordance with an exemplary embodiment. The six transistors shown at the top of FIG. 4 may form test cell 114-1 of FIG. 1, and the six transistors shown at the bottom of FIG. 4 may form test cell 114-2. In FIG. 1, only certain ones of the transistors providing a current path from TRACK_BL to ground are shown; in FIG. 4, the other transistors ordinarily used for SRAM functionality (and present in the nominal cells) are shown with an altered configuration that is adapted for timing tracking in accordance with some embodiments. In FIG. 4, NMOS transistor PD1-4a is forced into the "on" (closed switch) state because its gate is tied to a fixed voltage $V_{DD}$, which may be a logical high voltage, e.g., a positive power supply voltage. When TRACK_WL is asserted high to turn on transistor PG1-4a, current flows from TRACK_BL to ground along path P1 designated by a dashed arrow. The other transistors of the 6T configuration are repurposed for the test cell as follows. PMOS transistor PU1-4a is forced into the "off" (open switch) state because its gate is tied to $V_{TIED}$. CMOS transistors PU2-4a and PD2-4a, which would ordinarily form an inverter, are disabled from such inverter functionality by coupling a terminal of PU2-4a to $V_{TIED}$ instead of to the drain of PD2-4a. A terminal of PG2-4a is configured to be electrically floating by enlisting a bit line, which would ordinarily provide normal SRAM bit line functionality, for use as a floating bit line FLOAT.

Thus, the normal SRAM 6T configuration is adapted with a few modifications for timing tracking functionality. The lower part of FIG. 2 shows how test cell 114-2 may be similarly configured to provide a path P2 for current to flow from TRACK_BL to ground. Providing multiple test cells, and thus multiple paths for the tracked cell current to flow from TRACK_BL to ground, increases reliability, as the larger tracked cell currents decrease tracking delay, which may be due to the switching time of transistors in the test cells. The layout changes (relative to the layout of nominal SRAM cells) that implement the test cells in the circuit schematic of FIG. 4 are discussed below.

The transistors of the nominal bit cells and the test bit cells are formed by p regions, n regions, dielectrically coupled gate regions and conductive regions, in multiple layers over which the regions overlap. The regions are connected to one another along conductors and vias extending along and between layers, according to a solid state geometric layout. It is understood by one of ordinary skill that circuit components may be formed by forming various regions and layers over a semiconductor substrate. For example, a p-well or an n-well may be formed over a substrate. Oxide diffusion (OD) regions at the surface of p or n-wells may be doped n-type or p-type and may form semiconductor active areas. Polysilicon (PO) regions disposed above p or n-wells may control flow of current between OD regions. A layer of metal typically referred to as metal-0 (M0) may be formed above OD regions, in the form of M0 oxide diffusions (M0OD). Metal-0 polysilicon (M0PO) may be provided above PO regions. Vias referred to as VIA0 vias may be provided between M0OD and a higher metal layer referred to as metal-1 (M1). Vias referred to as VIA1 vias may be provided between M1 and a higher metal layer referred to as metal-2 (M2).

Figure 5A:
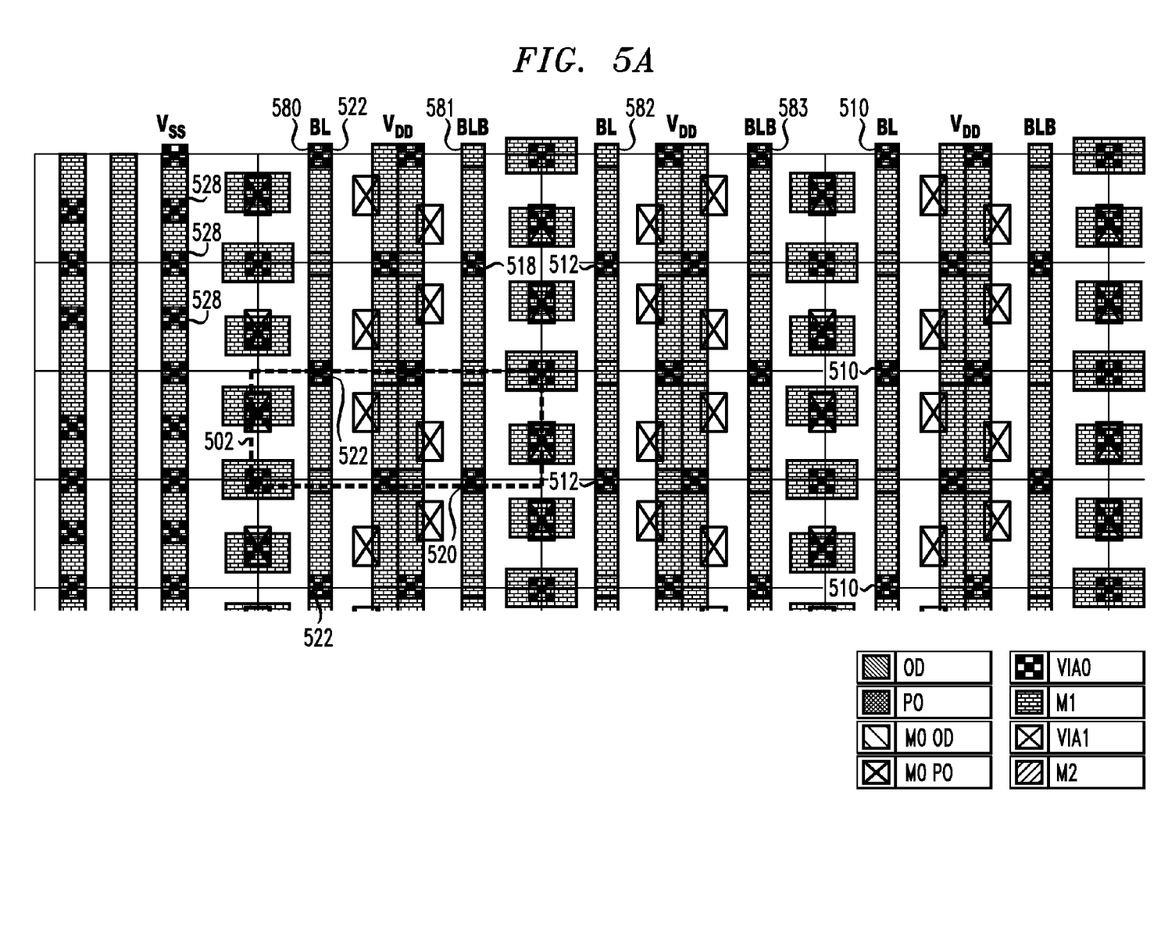
FIG. 5A is a layout diagram of a geometric layout of a nominal cell in accordance with an exemplary embodiment.
Figure 5B:
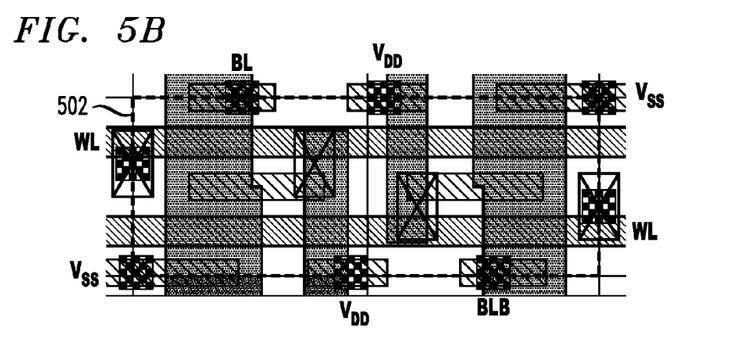
FIGS. 5B-5D are layout diagrams showing different layers of a region of the layout shown in FIG. 5A.
Figure 5C:
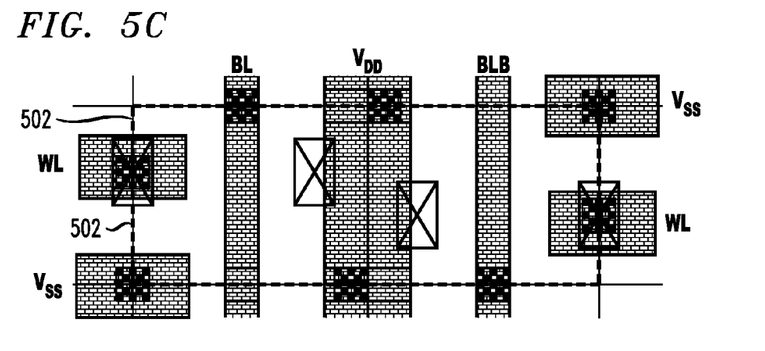
Figure 5D:
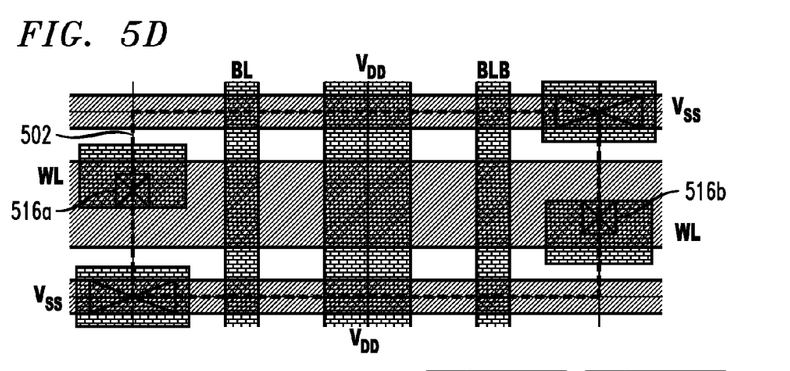

An example layout for the nominal bit cells is shown in FIGS. 5A-5D. FIG. 5A is a top (plan) view of various nominal cells, showing components at the metal-0 polysilicon (M0PO) and metal-1 (M1) layers and vias between the metal-0 (M0) and M1 layers (such vias are referred to as VIA0 vias). FIGS. 5B, 5C, and 5D provide plan views of components at various layers of a particular nominal cell 502. FIG. 5B shows components at the OD, polysilicon (PO), metal-0 oxide diffusion (M0OD), and metal-0 polysilicon (M0PO) layers, and VIA0 vias. FIG. 5C shows components at the M0P0 and M1 layers and VIA0 vias. FIG. 5D shows components at the M1 and metal-2 (M2) layers, and vias between the M1 and M2 layers (such vias are referred to as VIA1 vias). The layout of regions and vias in and between adjacent layers is substantially the same in the nominal cells and in the test cells; various differences are discussed below. With reference to the layout of nominal cells in FIGS. 5A-5D, and the layout of test cells in FIG. 6, the alterations for enlisting various components of nominal cells for timing tracking functionality in the test cells may be understood as follows.

Figure 6:
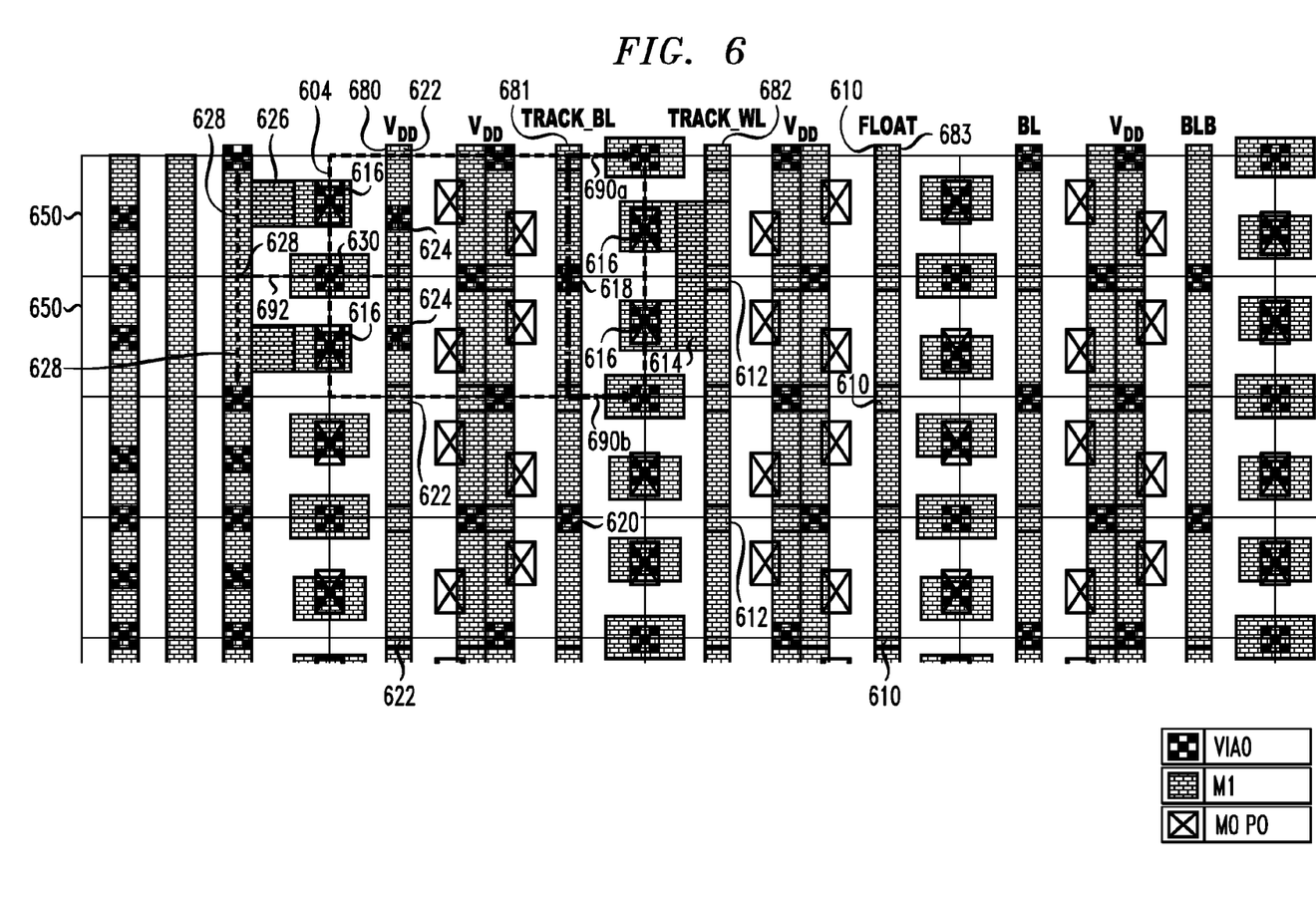
FIG. 6 is a layout diagram of a geometric layout of a test cell in accordance with an exemplary embodiment.

Certain changes in the layout are made to enlist bit lines 580, 581, 582, and 583 of FIG. 5A for timing tracking functionality in test cells of FIG. 6, and the equivalents in FIG. 6 are enlisted bit lines 680, 681, 682, and 683. Enlisted bit line 680 is tied high; enlisted bit line 681 provides TRACK_BL as in FIG. 1; enlisted bit line 682 provides TRACK_WL as in FIG. 1; and enlisted bit line 683 is electrically floating. Specific layout changes to effectuate such functionality of enlisted bit lines are described below with respect to an exemplary layout. It will be appreciated that similar alterations of other layouts can achieve the same functional results and are encompassed within the scope of this disclosure.

In FIG. 5A, VIA0 vias 510 are provided in nominal cells between M0 and M1 layers. These vias are removed in the test cells as shown at locations 610 in FIG. 6, e.g., by inserting a nonconductive region into the geometric layout at these locations. A nonconductive region optionally can be embodied as a gap. This alteration makes the enlisted bit line 683 float as denoted by FLOAT in FIG. 6.

In FIG. 5A, VIA0 vias 512 are provided in nominal cells between M0 and M1 layers. These vias are removed in the test cells as shown at locations 612 in FIG. 6, e.g., by inserting a nonconductive region into the geometric layout at these locations. A conductor 614 is inserted at the M1 layer to bridge adjacent M1 conductors as shown in FIG. 6. These alterations enlist bit line 682 as TRACK_WL.

In FIG. 5D, VIA1 vias 516a and 516b are provided in a nominal cell between M1 and M2 layers. These vias are removed in a test cell as shown at locations 616, e.g., by inserting a nonconductive region into the geometric layout at these locations.

In FIG. 5A, VIA0 via 518 is provided in a nominal cell between M0 and M1 layers. Corresponding via 618 is retained in a test cell for use in TRACK_BL.

In FIG. 5A, VIA0 via 520 is provided in a nominal cell between M0 and M1 layers. Corresponding via 620 is retained in a test cell as the load of TRACK_BL.

In FIG. 5A, VIA0 vias 522 are provided in nominal cells between M0 and M1 layers. These vias are removed in the test cells as shown at locations 622 in FIG. 6, e.g., by inserting a nonconductive region into the geometric layout at these locations.

FIG. 6 shows that VIA0 vias 624 are inserted in test cells between M0 and M1 layers to bridge M0OD to M1. This ties enlisted bit line 680 high, i.e., couples the enlisted bit line to $V_{DD}$.

At the edge of a test cell, near the edge of the SRAM array, it is desirable to reduce current leakage that may result from the timing tracking circuitry. For example, a possible leakage path 692 at the edge of test cell region 604 is shown in FIG. 6. To reduce leakage, the following layout modifications may be implemented. A conductive region 626 may be inserted in the test cell(s) at the M1 layer to reduce leakage. In FIG. 5A, VIA0 vias 528 are provided in nominal cells between M0 and M1 layers. These vias are removed in the test cells as shown at locations 628 in edge cells 650 in FIG. 6, e.g., by inserting a nonconductive region into the geometric layout at these locations. A VIA1 via between M1 and M2 layers is removed at location 630 in FIG. 6, e.g., by inserting a nonconductive region into the geometric layout at these locations.

Figure 7A:
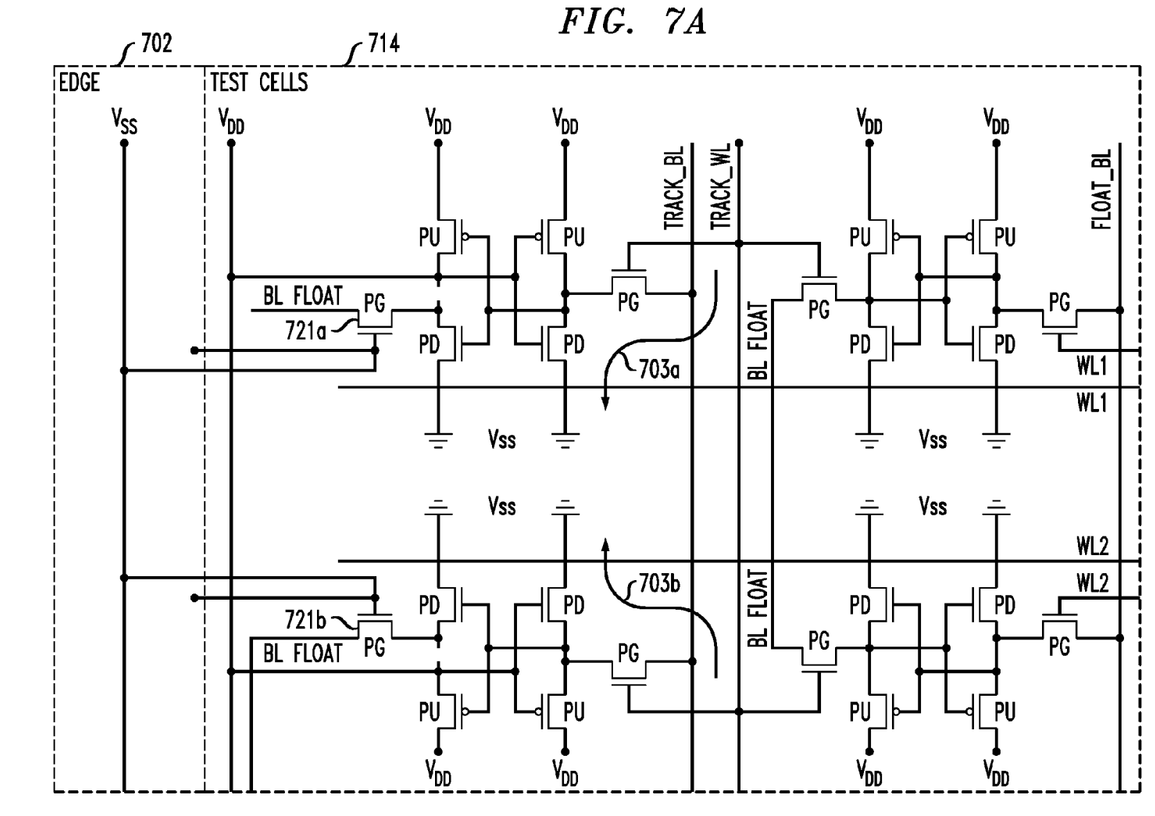
FIG. 7A is schematic diagram showing test cells in accordance with an exemplary embodiment.
Figure 7B:
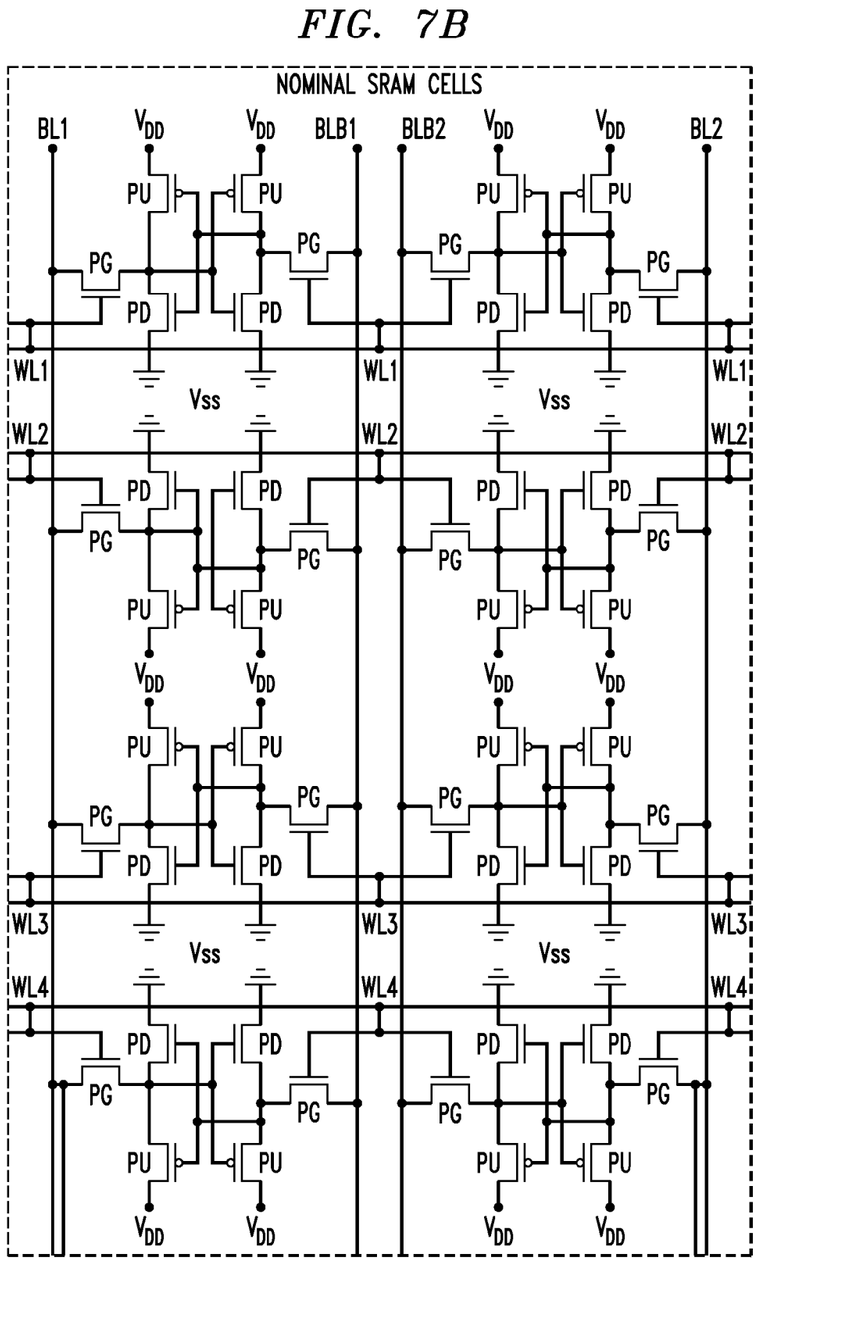
FIG. 7B is a schematic diagram showing nominal cells in accordance with an exemplary embodiment.
Figure 7C:
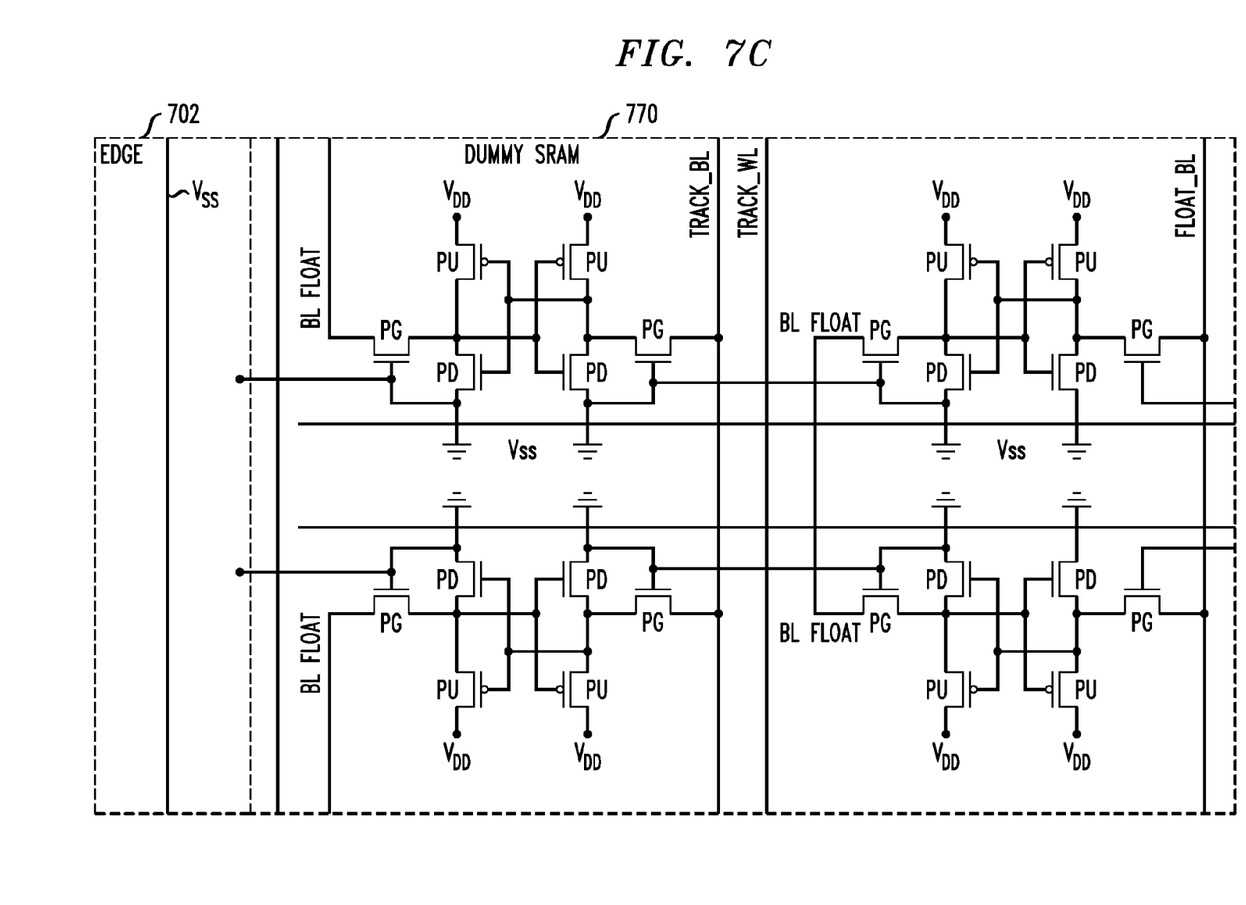
FIGS. 7C-7D are schematic diagrams showing dummy cells in accordance with an exemplary embodiment.
Figure 7D:
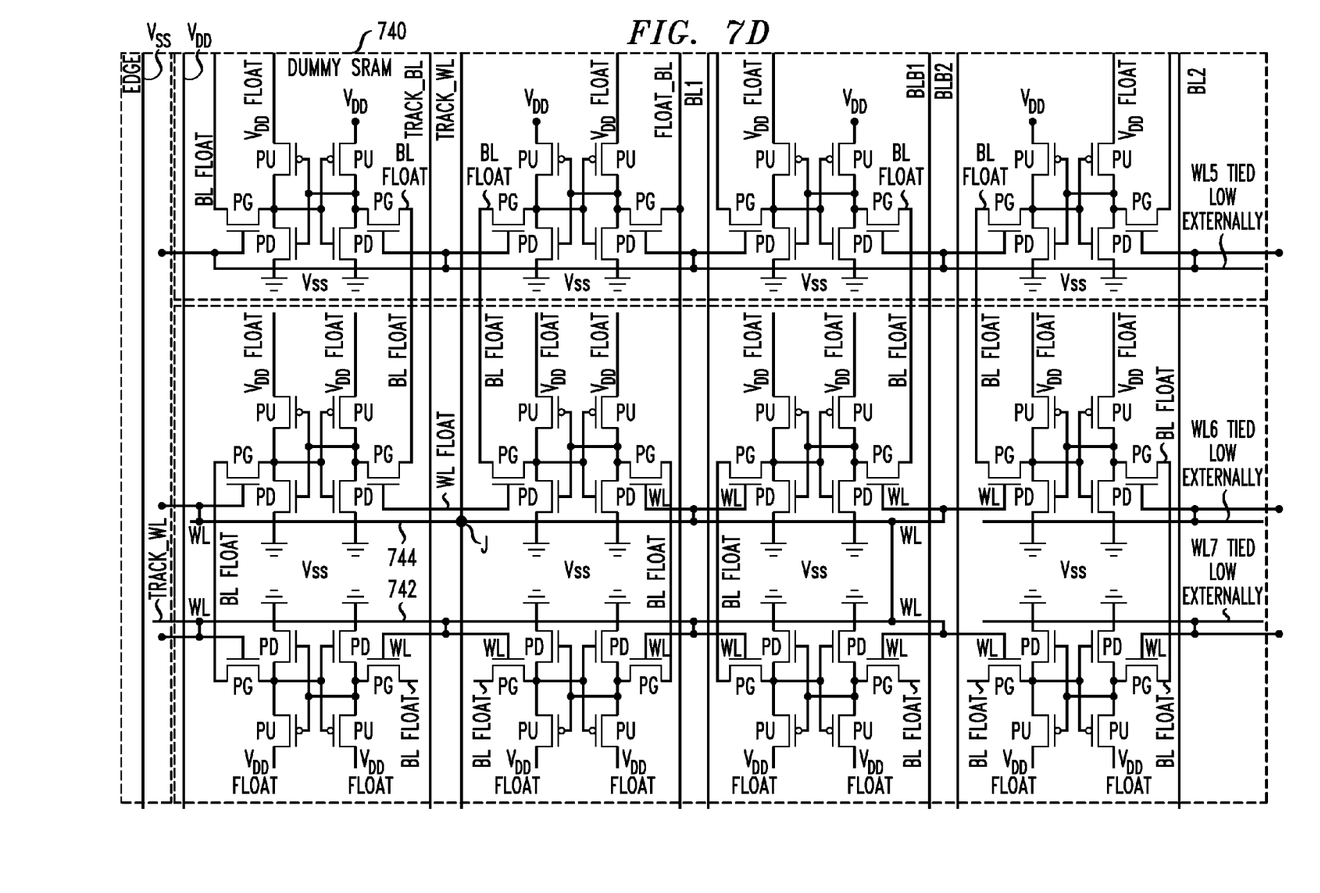

FIGS. 7A-7D are schematic diagrams of an example implementation in accordance with an exemplary embodiment; these diagrams provide additional details of circuitry of SRAM array 110 of FIG. 1. FIG. 7A shows test cells 714 and may be an expanded view of test cells in FIG. 1. FIG. 7B shows nominal SRAM cells and may be an expanded view of nominal SRAM cells 112 of FIG. 1. FIG. 7C shows dummy SRAM cells and may be an expanded view of dummy SRAM cells 170 of FIG. 1. FIG. 7D shows dummy SRAM cells and may be an expanded view of dummy SRAM cells 140 of FIG. 1.

FIG. 7A shows an example of four test cells, each having six transistors. The test cells in FIG. 7A may function like the test cells in FIG. 4. Cell currents 703a and 704b may be tracked for timing tracking, e.g., as a precharged enlisted bit line TRACK_BL is discharged to ground as described above. An edge region 702 is shown to the left of the test cells in FIG. 7A. Coupling gates of transistors 721a, 721b to ground ($V_{SS}$) or configuring them to be electrically floating reduces leakage. In the example of FIG. 7A, four test cells in a 2x2 arrangement are shown, although other arrangements of test cells, including other numbers of test cells, are possible. In the example 2x2 test cell arrangement, two test cells in the first (left) column each include a transistor (PG) coupled to enlisted bit lines TRACK_BL and TRACK_WL, and two test cells in the second (right) column each include a transistor (PG) coupled to enlisted bit line FLOAT BL that is electrically floating.

FIG. 7B shows an example of 8 nominal cells arranged in two columns and four rows. Other numbers of nominal cells are possible and may be arranged in various row/column configurations. Each nominal cell includes transistors that may function like the transistors in FIG. 3. Word lines WL1, WL2, WL3, and WL4 and bit lines BL1, BLB1, BL2, BLB2 address the nominal cells as shown in FIG. 7B.

FIG. 7C shows an example arrangement of dummy cells 770, which may correspond to dummy SRAM 170 of FIG. 1.

FIG. 7D shows an example arrangement of dummy cells 740, which may correspond to dummy SRAM 140 of FIG. 1. In this example, word lines WL5, WL6, and WL7 that would ordinarily address bit cells are enlisted to be tied low externally to support dummy cells 740 in their timing tracking role. The snaking, hairpin path provided by conductors 742 and 744 may correspond to the routing of conductors 142 and 144 in FIG. 1. As shown in FIG. 7D, WL7 and WL6 are adjacent word lines. Conductors 742 and 744 are portions of these word lines that are enlisted to convey a word line signal for timing tracking Conductors 742 and 744 are coupled as shown, e.g., with a jumper, at the third column from left in FIG. 7D. Conductor 744 is coupled to enlisted bit line TRACK_WL as shown at point J. Besides this "U-shaped" routing, other shapes are possible as well, e.g., a staircase pattern using enlisting additional word lines. Enlistment of additional word lines for such a path may result in an increased number of dummy cells and a reduced number of nominal cells available for normal SRAM operations.

Thus, various embodiments provide capabilities for monitoring full bit line back- end-of-line (BEOL) capacitance loading. Process variation related to embodying for timing circuitry is minimized, because the front-end-of-line (FEOL) and M0 are kept the same, i.e., not changed for test cells relative to the layout of nominal cells. Because the timing tracking is implemented using the SRAM itself, i.e., within an existing SRAM array to avoid the need for a standalone, external timing tracking circuit, an existing SPICE model may advantageously be used for circuit simulation. Routing the path of a generated word line signal in a hairpin configuration, e.g., as with conductors 142 and 144 of FIG. 1, enables emulation of particular topographical characteristics, such as an access of a cell in a remote corner (e.g., upper right corner of the array in FIG. 1). Current leakage associated with timing tracking functionality is reduced with modifications of the layout at test cells as described above.

Although SRAM 6T cells have been described above, other types of memory cells may be used as well, including other types of memory than SRAM and other types of SRAM configurations than 6T, e.g., eight transistor (8T) or ten transistor (10T) configurations. In such memory types or configurations: (1) a transistor in at least one storage node is maintained in a conductive (or nonconductive) condition typical of a predetermined logic state (e.g., forced to a condition representing logic high) and used as a test cell, the transistor being switched by a timing test signal along a route otherwise used in the array layout as a bit line in a nominal cell; (2) a word line similarly is decoupled from a normal (nominal) cell array and is coupled to a route (originally used as a bit line in an adjacent nominal cell) as a track WL; and (3) when the track WL turns on the transistor (such as a PG transistor and a PD transistor of a test cell in an SRAM example), a current from track BL to Vss is generated and can be detected to stop a timer that was started when the timing test signal was generated. In this way, the representative time delay to and from the test cell provides a measure from which the delays along other paths are inferred, e.g., in an SRAM. Timing tracking methods and circuits as described above can also be applied to 8T and 10T configurations such as those disclosed in the following patents and publications, which are hereby incorporated by reference herein in their entireties: U.S. Pat. Pub. 2011/0182112 entitled "10T SRAM cell with near dual port functionality" to Houston; U.S. Pat. No. 6,975,532 entitled "Quasi-static random access memory" to Kosonocky et al.; U.S. Pat. No. 7,898,894 entitled "Static random access memory (SRAM) cells" to Chang et al.; U.S. Pat. No. 7,177,177 entitled "Back-gate controlled read SRAM cell" to Chuang et al.; and "A Low Leakage 9T SRAM Cell for Ultra-Low Power Operation" by Lin et al., GLSVLSI'08, May 4-6, 2008, Orlando, Fla., ACM 978-1-59593-999-9/08/05.

Although examples are illustrated and described herein, embodiments are nevertheless not limited to the details shown, since various modifications and structural changes may be made therein by those of ordinary skill within the scope and range of equivalents of the claims.

What is claimed is:

1. A memory apparatus comprising:
   a plurality of bit cells in an array,
   a plurality of word lines and bit lines meeting at the bit cells and operated for selecting a given bit cell in the array by concurrently activating a word line and a bit line coupled to said given cell, for one of reading and writing to one or more selected bit cells,
   a pulse generator configured to generate a test signal for operating a test bit cell at a predetermined location in the array, said test bit cell including at least one switching transistor;
   a conductor coupling said pulse generator to said test bit cell, said conductor configured to conduct the test signal to the test bit cell, said conductor comprising an electrical path including at least a part of one of said bit lines and word lines that is enlisted for timing tracking purposes, wherein the enlisted one of said bit lines and word lines carries the test signal for changing a state of the switching transistor at the selected one or more of the bit cells; and
   a timing measurement circuit configured to detect operation of the switching transistor and to determine a time delay between generation of the test signal by the pulse generator and detection of a current switched by the switching transistor, said delay being a function of the location of the test bit cell in the array.

2. The memory apparatus of claim 1, wherein the at least one switching transistor comprises a passing gate (PG) transistor and a pull down (PD) transistor of the test bit cell.

3. The memory apparatus of claim 1, wherein the plurality of bit cells comprises a plurality of static random access memory (SRAM) bit cells, said SRAM bit cells including nominal bit cells and said test bit cell,
   wherein a first bit line and a second bit line are enlisted for testing a propagation time between generation of the test signal and sensing of the current switched by the switching transistor,
   wherein said first and second enlisted bit lines are disabled for random access to the bit cells,
   wherein each nominal cell comprises a pair of CMOS inverters cross coupled between two nodes and operationally determining a logic state, and a pair of access transistors that couple associated bit line signals and word line signals to the nominal cell for one of reading and changing the logic state, each nominal cell including a first transistor (PG1), a second transistor (PU1), a third transistor (PD1), a fourth transistor (PG2), a fifth transistor (PU2), and a sixth transistor (PD2); wherein PU1 with PD1 and PU2 with PD2 form the CMOS inverters and have gates coupled to one of the nodes and a junction at an output coupled to an other of the nodes, the nodes respectively being normally floating and coupled through PG1 and PG2 to complementary said associated bit line signals when enabled by the word line signals,
   wherein each test cell includes a first transistor (PG1), a second transistor (PU1), a third transistor (PD1), a fourth transistor (PG2), a fifth transistor (PU2), and a sixth transistor (PD2), and at least one test cell is coupled, by a third bit line enlisted for logic state maintenance, to a fixed voltage to force the logic state of the test cell to a stable logic value such that accessing said test cell couples the test current through a predetermined one of transistors PU1, PD1, PU2, PD2 of said test cell.

4. The memory apparatus of claim 3, wherein the transistors of the nominal bit cells and the test bit cells are formed by p regions, n regions, dielectrically coupled gate regions and conductive regions, in multiple layers over which said regions overlap and are connected to one another along conductors and vias extending along and between layers, according to a solid state geometric layout;
   wherein said layout of regions and vias in and between adjacent layers is substantially the same in the nominal cells and in the test cells,
   wherein at least one of a conductive path to the fixed voltage for forcing the logic state of the test cell, and a conductive path for coupling current through PG1 or PG2 of a test cell to a corresponding enlisted bit line signal when enabled by the second enlisted bit line is formed by altering the solid state geometric layout of the nominal bit cells at the test bit cell, by one of inserting a conductive region and inserting a nonconductive region into said geometric layout at least at one of the layers over which the regions overlap and the vias extending between layers; and
   wherein accessing the test bit cell couples the test current through said predetermined one of transistors PU1, PD1, PU2, PD2 according to a time delay associated with the location of the test cell in the array.

5. The memory apparatus of claim 4, comprising at least two said test cells, each of said two test cells including a transistor coupled to the first and second enlisted bit lines.

6. The memory apparatus of claim 5, comprising at least four said test cells arranged in two rows and two columns, the test cells in one of the columns both having a transistor coupled to a fourth bit line enlisted to be electrically floating.

7. The memory apparatus of claim 5, comprising a plurality of said test cells arranged adjacent to one another and coupled commonly to at least one of the enlisted bit lines.

8. The memory apparatus of claim 4, wherein the SRAM cells include at least two test cells, one of the test cells having a transistor coupled to a fourth bit line enlisted to remain electrically floating.

9. The memory apparatus of claim 4, wherein the SRAM cells further include at least one dummy bit line tracking cell, said dummy bit line tracking cell including a first transistor (PG1), a second transistor (PU1), a third transistor (PD1), a fourth transistor (PG2), a fifth transistor (PU2), and a sixth transistor (PD2);

wherein the PU1, PD1, PU2, and PD2 transistors of said dummy bit line tracking cell are configured to form a pair of cross-coupled CMOS inverters, and wherein the PG2 transistor of said dummy bit line tracking cell is coupled to the first enlisted bit line;

wherein the transistors of the dummy bit line tracking are formed by p regions, n regions, dielectrically coupled gate regions and conductive regions, in multiple layers over which said regions overlap and are connected to one another along vias extending between layers, according to a solid state geometric layout; and wherein said layout of regions and vias in and between adjacent layers is substantially the same in the nominal cells and in the dummy bit line tracking cells.

10. The memory apparatus of claim 9, wherein the solid state geometric layout of the nominal bit cells is altered at one of the dummy bit line tracking cells by inserting a nonconductive region into said geometric layout at a via extending between two of the layers.

11. The memory apparatus of claim 4, wherein a fourth bit line is enlisted to be electrically floating, and said fourth enlisted bit line is formed by altering the solid state geometric layout of the nominal bit cells at one of the test bit cells by inserting a nonconductive region into said geometric layout at one of a conductor extending along one of the layers and a via extending between at least two of the layers.

12. The memory apparatus of claim 4, wherein the second enlisted bit line is formed by altering the solid state geometric layout of the nominal bit cells at one of the test bit cells by:

inserting a nonconductive region into said geometric layout at one of a conductor extending along one of the layers and a via extending between at least two of the layers, and inserting a conductive region into said geometric layout at one of the layers.

13. The memory apparatus of claim 4, wherein one of the word lines is disabled from addressing one of the test cells by inserting a nonconductive region into said geometric layout at one of a conductor extending along one of the layers and a via extending between two of the layers.

14. The memory apparatus of claim 4, wherein the third enlisted bit line is formed by altering the solid state geometric layout of the nominal bit cells at one of the test bit cells by inserting a conductive region into said geometric layout to add one of a conductor extending along one of the layers and a via extending between two of the layers.

15. The memory apparatus of claim 4, wherein the gate of a PG1 transistor of one of the test cells is coupled to a ground node by altering the solid state geometric layout of the nominal bit cells at one of the test bit cells by inserting a conductive region into said geometric layout at one of the layers.

16. A method of timing an operation in a static random access memory including a plurality of SRAM bit cells in an array, the bit cells arranged in a pattern having multiple word lines and bit lines meeting at the bit cells and operated for selecting a given cell by concurrently activating a word line and a bit line coupled to said given cell, the method comprising:

generating a word line signal at a pulse generator;

conducting the word line signal along a first path comprising multiple word lines, the first path having a first predetermined length;

conducting the word line signal along a second path having a second predetermined length, second path comprising a first bit line enlisted for tracking propagation times, wherein the first enlisted bit line is disabled from addressing an SRAM cell;

coupling a second bit line, enlisted for tracking propagation times, to a power supply voltage via a first switch;

conducting the word line signal to the first switch;

opening the first switch, based on the word line signal, to decouple the second enlisted bit line from the power supply voltage;

closing a second switch, based on the word line signal conducted along the first enlisted bit line, to couple the second enlisted bit line to a ground node; and coupling the second enlisted bit line to the pulse generator, to provide a timing track signal to the pulse generator.

17. The method of claim 16, further including turning off the word line signal based on a track signal received at the pulse generator along the second enlisted bit line.

18. The method of claim 16, further including:

receiving a track signal at the pulse generator along the second enlisted bit line; and determining a time interval between generation of the word line signal and reception of the track signal.

19. The method of claim 16, further including coupling a third switch, in a path between the second switch and the ground node, to a fixed voltage to maintain the third switch in a closed state.

20. An apparatus comprising:

a plurality of SRAM bit cells in an array, the bit cells arranged in a pattern having multiple word lines and bit lines meeting at the bit cells and operated for selecting a given cell by concurrently activating a word line and a bit line coupled to said given cell, the SRAM cells including nominal cells and at least one test cell, wherein a first bit line and a second bit line are enlisted for tracking a propagation time between selecting the at least one test cell and sensing of a resulting test current at said test cell, and said first and second enlisted bit lines are disabled from addressing said at least one test cell;

a word line pulse generator configured to generate a word line signal;

a conductor configured to conduct the word line signal to a first word line;

a first electrical path comprising the first word line and at least one other word line, the path intersecting the first enlisted bit line;

a switch, controllable by the word line signal, the first switch configured to selectively couple the second enlisted bit line to a positive power supply voltage; and a second electrical path coupling the second enlisted bit line and the word line pulse generator;

wherein at least one of the test cells includes a passing gate (PG) transistor having a gate coupled to the first enlisted bit line, and a pull down (PD) transistor having a gate coupled to a fixed voltage that forces said PD transistor into a conducting state, said PG and PD transistors configured to couple the second enlisted bit line to a ground node when the word line signal on the first enlisted bit line controls the PG transistor to conduct current.

* * * * *